(12) United States Patent
Mikalo et al.

(10) Patent No.: US 9,556,509 B2
(45) Date of Patent: Jan. 31, 2017

(54) VAPOUR DEPOSITION

(75) Inventors: Ricardo Mikalo, Heideblick (DE); Jens Dienelt, Radebeul (DE)

(73) Assignee: FLEXENABLE LIMITED, Cambridge (GB)

( * ) Notice: Subject to any disclaimer, the term of this patent is extended or adjusted under 35 U.S.C. 154(b) by 646 days.

(21) Appl. No.: 13/885,593

(22) PCT Filed: Nov. 21, 2011

(86) PCT No.: PCT/EP2011/070523
§ 371 (c)(1),
(2), (4) Date: Jul. 8, 2013

(87) PCT Pub. No.: WO2012/069395
PCT Pub. Date: May 31, 2012

(65) Prior Publication Data
US 2013/0277204 A1   Oct. 24, 2013

(30) Foreign Application Priority Data

Nov. 22, 2010   (GB) .................................. 1019727.5

(51) Int. Cl.
*C23C 14/00* (2006.01)
*C23C 14/34* (2006.01)
*H01J 37/34* (2006.01)

(52) U.S. Cl.
CPC ........... *C23C 14/34* (2013.01); *C23C 14/3407* (2013.01); *H01J 37/3414* (2013.01); *H01J 37/3417* (2013.01); *H01J 37/3426* (2013.01)

(58) Field of Classification Search
CPC .................................................. C23C 14/3407
See application file for complete search history.

(56) References Cited

U.S. PATENT DOCUMENTS

| | | | |
|---|---|---|---|
| 4,412,907 A | 11/1983 | Ito et al. | |
| 2006/0266639 A1* | 11/2006 | Le | C23C 14/3407 204/192.1 |
| 2006/0283705 A1* | 12/2006 | Tanase | B23K 15/0093 204/298.12 |
| 2007/0289864 A1 | 12/2007 | Ye et al. | |

(Continued)

FOREIGN PATENT DOCUMENTS

| | | |
|---|---|---|
| JP | 60-065529 A | 4/1985 |
| JP | 63-100177 A | 5/1988 |

(Continued)

OTHER PUBLICATIONS

International Search Report for PCT/EP2011/070523 dated Feb. 27, 2012.
British Search Report for GB1019727.5 dated Feb. 13, 2012.

*Primary Examiner* — Keith Hendricks
*Assistant Examiner* — Timon Wanga
(74) *Attorney, Agent, or Firm* — Sughrue Mion, PLLC

(57) ABSTRACT

A method, comprising: generating a vapor of a material from a source of said material comprising a plurality of separate solid pieces of said material supported on a surface of a base in a configuration in which said plurality of solid pieces of said target material are arranged at two or more levels to cover the whole of said surface of said base while providing a gap between adjacent pieces at the same level; and depositing said material from said vapor onto a substrate.

7 Claims, 5 Drawing Sheets

(56) References Cited

U.S. PATENT DOCUMENTS

2007/0289869 A1* 12/2007 Ye ..................... C23C 14/3407
204/298.12

FOREIGN PATENT DOCUMENTS

| JP | 63-143258 A | 6/1988 |
|----|-------------|--------|
| JP | 10-121232 A | 5/1998 |
| JP | 2003-027227 A | 1/2003 |
| WO | 2006/127221 A2 | 11/2006 |
| WO | 2011/092027 A1 | 8/2011 |

* cited by examiner

VAPOUR DEPOSITION

CROSS REFERENCE TO RELATED APPLICATIONS

This application is a National Stage of International Application No. PCT/EP2011/070523 filed Nov. 21, 2011, claiming priority based on United Kingdom Patent Application No. 1019727.5 filed Nov. 22, 2010, the contents of all of which are incorporated herein by reference in their entirety.

The present invention relates to depositing a film of material onto a substrate from vapour form. In one embodiment, it relates to depositing a film of material onto a substrate by a physical vapour deposition technique known as sputtering.

With reference to FIG. 1, sputtering involves bombarding a solid mass (known as a "target") 1 of the material of which a film is to be deposited on a substrate 2 with high-energy particles to eject atoms or molecules of the material from the target 1, and the ejected atoms or molecules of the material condense on the substrate 2 as a thin film. The abovementioned high-energy particles can be provided by generating a burning argon plasma, i.e. ionized argon atoms and free electrons, between the target 1 and the substrate 2. The target and substrate also serve as the cathode and anode, respectively, for producing the argon plasma. The Ar+ ions from the plasma bombard the negatively charged target and liberate atoms or molecules from the target, which liberated atoms or molecules of the target material hit the substrate and are deposited thereon.

For large area display devices and other devices that require the deposition of material over a large area, segmentation of the target has been identified as a way of facilitating the production of large area targets. However, the inventors for the present invention have found that the use of a segmented target can result in relatively high levels of impurities in the deposited film, particularly towards the end of the life of the target. The inventors have identified the challenge of facilitating vapour deposition over relatively large areas whilst achieving high levels of purity.

It is an aim of the present invention to provide a technique that meets this challenge.

The present invention provides a method, comprising: generating a vapour of a material from a source of said material comprising a plurality of separate solid pieces of said material supported on a surface of a base in a configuration in which said plurality of solid pieces of said target material are arranged at two or more levels to cover the whole of said surface of said base whilst providing a gap between adjacent pieces at the same level; and depositing said material from said vapour onto a substrate.

The present invention also provides an apparatus for use in generating a vapour of a material from a source of said material, and depositing said material from said vapour onto a substrate; wherein said apparatus comprises a plurality of separate solid pieces of said material supported on a surface of a base in a configuration in which said plurality of solid pieces of said target material are arranged at two or more levels to cover the whole of said surface of said base whilst providing a gap between adjacent pieces at the same level.

In one embodiment, said plurality of solid pieces are arranged alternately at two levels.

In one embodiment, said plurality of solid pieces comprise a plurality of upper pieces of said material at a first, upper level, and one or more lower pieces of said material at a second, lower level; and wherein the plurality of said upper pieces at said first, upper level have a greater combined area than said one or more lower pieces at said second, lower level.

In one embodiment, said base defines one or more recesses, and the method further comprises locating said one or more lower pieces in said one or more recesses.

In one embodiment, said lower pieces are located on a flat surface of said base without recesses for receiving said lower pieces In one embodiment, said one or more lower pieces are located in said one or more recesses on said base before mounting the upper pieces on the base.

In an alternative embodiment, said one or more lower pieces and upper pieces are assembled together before mounting the assembly on said base.

In one embodiment, said plurality of upper pieces are mounted on the base, and said one or more lower pieces are forced through gaps defined at said first level between said plurality of upper pieces.

In one embodiment, said plurality of upper pieces are mounted on said base, and said one or more lower pieces are laterally slid into position on said base.

In one embodiment, said material is a noble metal.

In one embodiment, said material is gold.

In one embodiment, said base comprises a copper plate.

There is also provided a method, comprising: generating a vapour of a material from a source of said material comprising a plurality of separate solid pieces of said material supported on a surface of a base in a configuration in which said plurality of solid pieces of said target material include a plurality of first solid pieces arranged at a common level and defining gaps therebetween, and one or more second solid pieces arranged so as to extend underneath edge portions of a respective adjoining pair of said first solid pieces such the first and second solid pieces together cover the whole of said surface of said base; and depositing said material from said vapour onto a substrate.

Embodiments of the present invention are described in detail hereunder, by way of example only, with reference to the accompanying drawings, in which.

Figure 1:
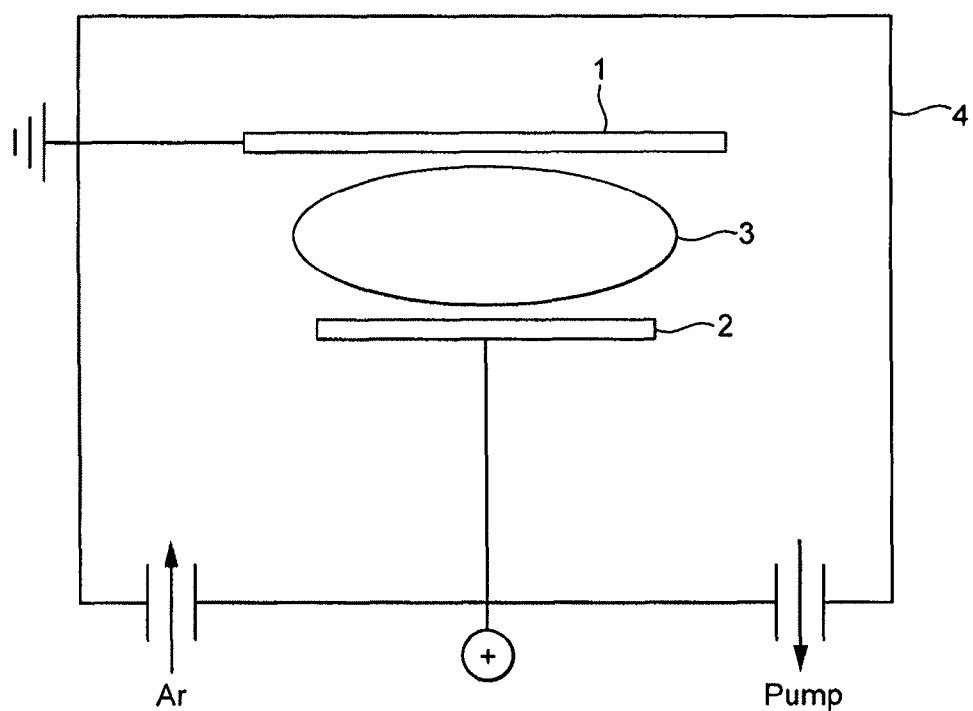
FIG. 1 illustrates a sputter deposition apparatus in which embodiments of the present invention can be implemented.

With reference to FIG. 1, a target 1 and a substrate 2 onto which a film of the material of the target 1 is to be deposited face each other in a sputtering chamber 4. In use, the sputtering chamber 4 is evacuated by means of an external pump (not shown), followed by the introduction of argon gas. To the substrate 2 is applied a high positive voltage relative to the target 1. The voltage applied to the substrate is high enough to generate a plasma 3 between the target 1 and the substrate 2, and atoms/molecules of the target material are ejected from the target 1 and deposit on the substrate 2 as a thin film.

In each of the four embodiments illustrated at FIGS. 2, 3, 4 and 5, the target comprises an array of gold plates 10 secured by solder 12 to the surface of a copper backing plate 14 so as to face the substrate 2. The gold plates 10 are arranged so as to leave a gap between adjacent plates to accommodate thermal expansion of the gold plates caused by a temperature rise of the gold plates 10, which temperature rise is a feature of the high-power sputtering process. Without a sufficient gap between the gold plates 10, there is a risk of the solder joints failing. Depending on the degree of thermal expansion, the gap will typically have a size of up to about 0.1 mm or even several tenths of millimeters.

At a lower level beneath the gold plates 10 are arranged gold wires 16 that cover the portions of the copper backing plate not covered by the gold plates 10. These gold wires serve to prevent the deposition on the substrate 2 of material from the copper backing plate 14. The contamination by copper of a gold film deposited on the substrate could be undesirable, for example, when the gold film provides conductive elements of an organic electronics device including one or more layers deposited from solution in organic solvents. For example, there is the concern for such devices about contamination by copper leading to systematic reliability issues. The gold wires have a diameter bigger than the size of the gap, and in one example have a diameter of about at least twice the size of the gap between the gold plates 10.

Figure 2:
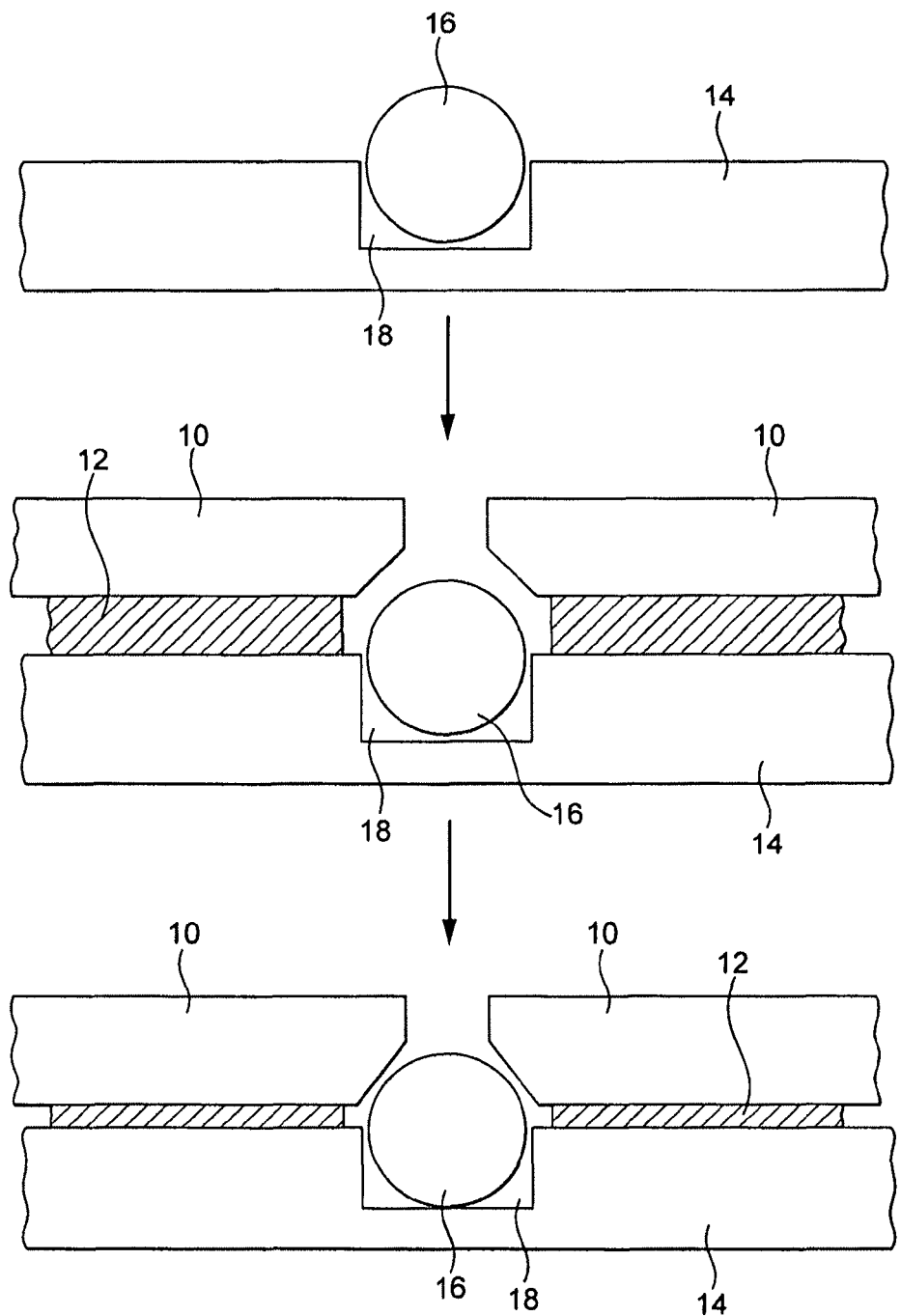
FIG. 2 illustrates the preparation of a target in accordance with a first embodiment of the present invention.

In the technique illustrated in FIG. 2, the copper backing plate 14 is provided with recesses 18 (only one is shown in FIG. 2) for receiving the gold wires 16. The recesses are sized to substantially match the dimensions of the gold wires 16. The gold wires 16 are first located in the recesses 18. Then, a solder paste 12 is applied to the surface of the copper backing plate 14 between the recesses 16, and the gold plates are mounted on the copper backing plate 14. The resulting assembly is then heated to solder the gold plates 10 to the copper backing plate 14. Alternatively, pre-heated liquid solder is used to solder the plates to the copper backing plate, thereby avoiding the need for a heating step after mounting the gold plates.

Figure 3:
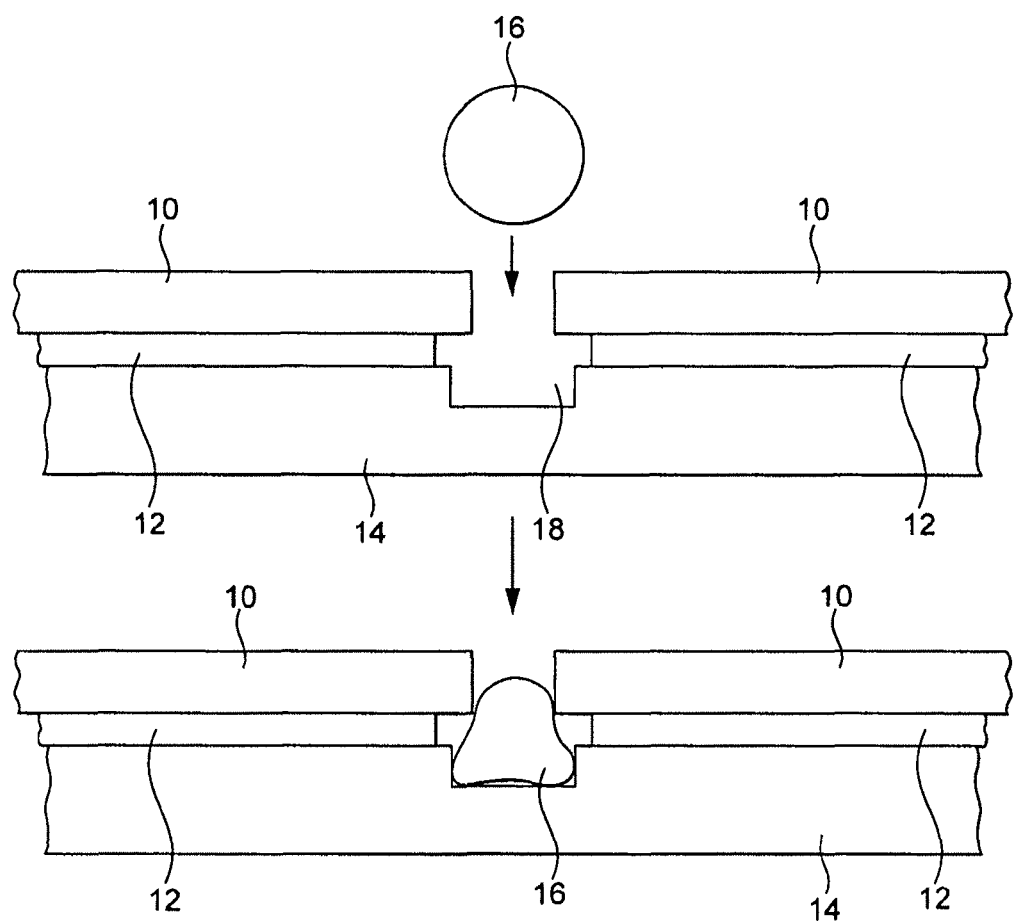
FIG. 3 illustrates the preparation of a target in accordance with a second embodiment of the present invention.

In one variation illustrated in FIG. 3, the gold plates 10 the soldering of the gold plates to the copper backing plate is carried out first, and then the gold wires 16 are forced into the recesses 18 below the gaps between the gold plates 10 by hammering the wires 16 through the gaps between the gold plates 10.

Figure 4:
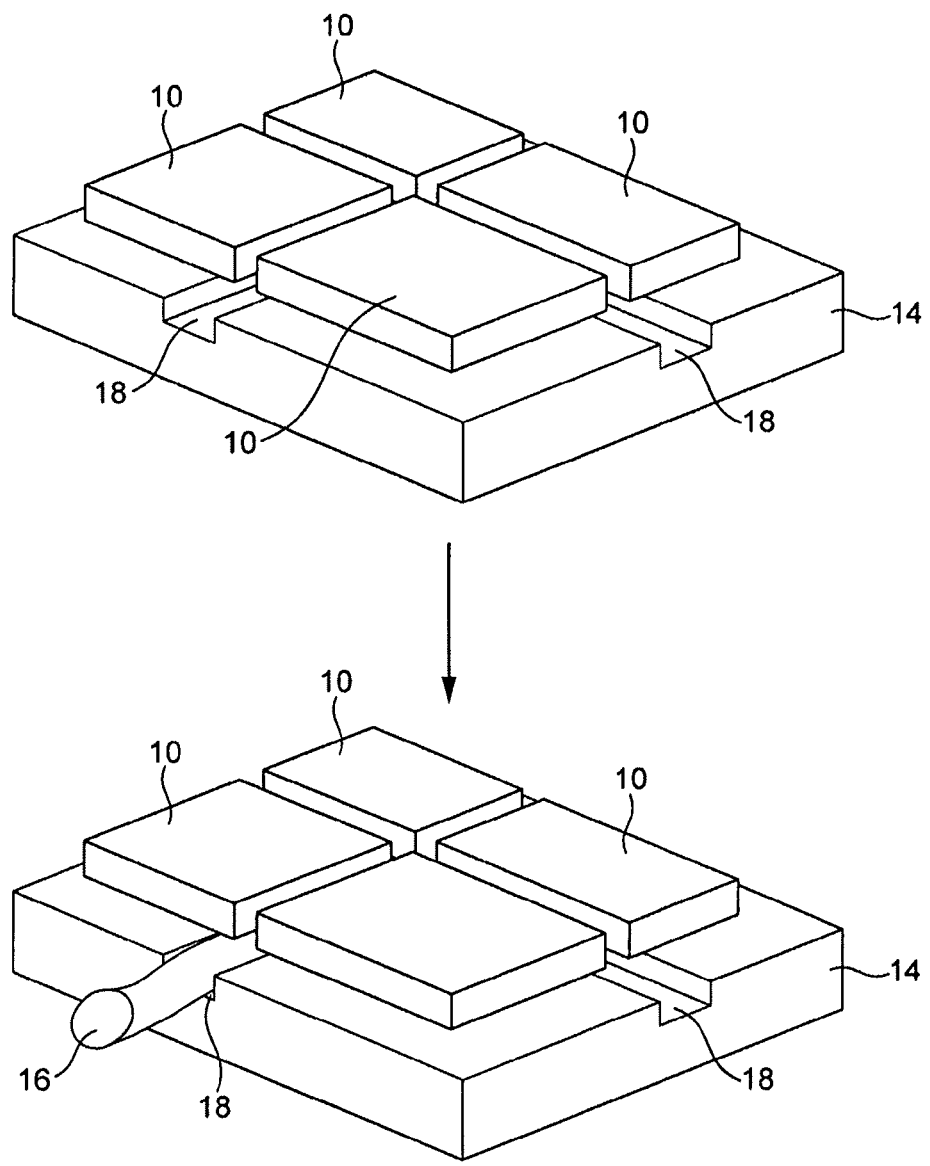
FIG. 4 illustrates the preparation of a target in accordance with a third embodiment of the present invention.

In another variation illustrated in FIG. 4, the soldering of the gold plates 10 to the copper backing plate 14 is also carried out first, but the gold wires 16 are instead introduced into the recesses from the side at a level below the gold plates 10.

Figure 5:
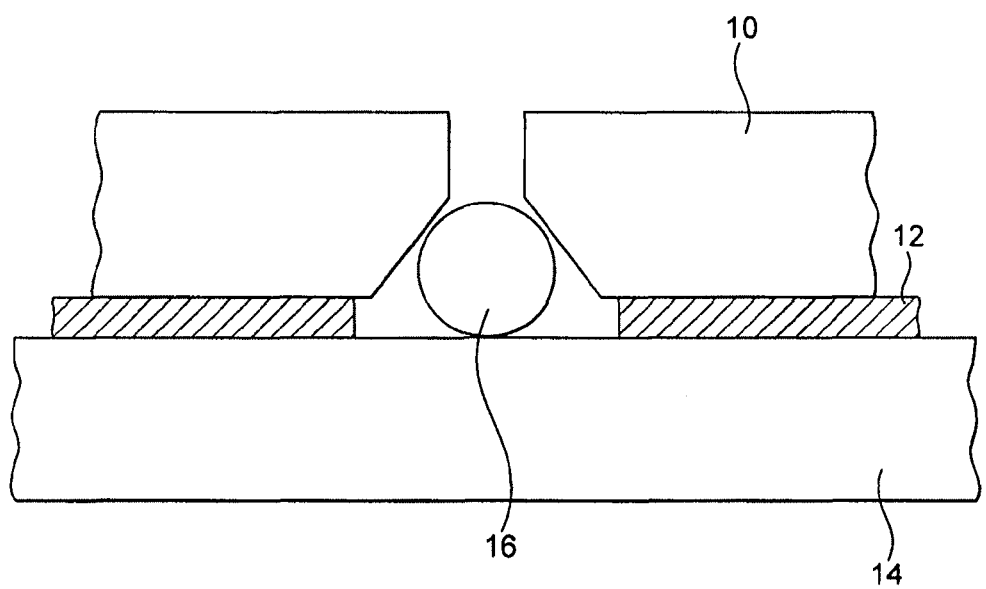
FIG. 5 illustrates the preparation of a target in accordance with a fourth embodiment.

In another variation illustrated in FIG. 5, the copper backing plate 14 does not define any recesses/grooves designed to receive the gold wires 16; instead the copper backing plate has a substantially flat surface, and the gold wires 16 sit on this flat surface together with the coating of solder paste 12 used to secure the gold plates 10 to the copper backing plate. This alternative embodiment is similar to the other embodiments described above in that the upper surface of the gold wires 16 is at a lower level than the upper surface of the gold plates 16, and a portion of each gold wire 16 extends under edge portions of adjacent gold plates 16.

We have used the example of the deposition of a gold film on a substrate by sputter deposition using an Argon plasma to describe embodiments of the present invention; but the above-described techniques are also applicable to the deposition of films of other materials and/or using other gas plasmas.

Also, we have mentioned above how contamination by copper can cause systematic reliability problems in organic electronics devices including one or more layers deposited from solution in organic solvents; but the above-described techniques are also of use in producing other kinds of devices.

In addition to any modifications explicitly mentioned above, it will be evident to a person skilled in the art that various other modifications of the described embodiment may be made within the scope of the invention.

The invention claimed is:

1. A method, comprising: generating a vapour of a material from a source of said material comprising a plurality of separate solid pieces of said material supported on a surface of a base in a configuration in which said plurality of solid pieces of said target material include a plurality of first solid pieces arranged at a common level and defining gaps therebetween, and one or more solid wires in locations underneath edge portions of a respective adjoining pair of said first solid pieces such that the first solid pieces and the one or more solid wires together cover the whole of said surface of said base; and depositing said material from said vapour onto a substrate; wherein the method comprises mounting said plurality of first solid pieces on the base, and then introducing said one or more solid wires into said locations by hammering said one or more solid wires through said gaps.

2. The method according to claim 1, wherein the plurality of first solid species have a greater combined area than said one or more solid wires.

3. The method according to claim 1, wherein said base defines one or more recesses, and said locations of the one or more solid wires are in said one or more recesses.

4. The method according to 1, wherein said locations of said one or more solid wires are on a flat surface of said base without recesses for receiving said one or more solid wires.

5. The method according to claim 1, wherein said material is a noble metal.

6. The method according to claim 5, wherein said material is gold.

7. The method according to claim 5, wherein said base comprises a copper plate.

* * * * *